United States Patent [19]
Webb

[11] 4,090,145
[45] May 16, 1978

[54] DIGITAL QUADRATURE DEMODULATOR

[76] Inventor: Joseph A. Webb, 6317 W. Mississippi Pl., Lakewood, Colo. 80226

[21] Appl. No.: 224,523

[22] Filed: Feb. 8, 1972

Related U.S. Application Data

[63] Continuation-in-part of Ser. No. 809,720, Mar. 24, 1969, abandoned, and Ser. No. 30,169, Apr. 20, 1970, abandoned.

[51] Int. Cl.$^2$ .................. H03D 1/00; H03D 3/00; H03D 5/00
[52] U.S. Cl. ................................... 329/1; 325/324; 328/109; 328/135; 328/140; 328/151; 328/166; 329/50; 329/122; 329/126; 329/135; 329/147
[58] Field of Search ............. 329/122, 124, 125, 1, 329/135, 147, 110, 126, 50; 328/151, 135, 140, 109, 166; 307/229, 232; 325/324, 325

[56] References Cited
U.S. PATENT DOCUMENTS

| | | | |
|---|---|---|---|
| 3,320,552 | 5/1967 | Glasser | 329/50 X |
| 3,327,231 | 6/1967 | Guggenbuhl | 329/50 X |
| 3,337,796 | 8/1967 | Hentschel et al. | 328/166 X |
| 3,458,821 | 7/1969 | Clarridge | 307/229 |
| 3,490,049 | 1/1970 | Choquet et al. | 329/126 |

*Primary Examiner*—Siegfried H. Grimm
*Attorney, Agent, or Firm*—Carlos A. Torres; E. Richard Zamecki

[57] ABSTRACT

A quadrature analog-to-digital sampler, operating at a minimum sampling rate equal to the bandwidth of the input signal provides a pair of quadrature related digital signals which are input to first and second digital computers. The first computer calculates the instantaneous amplitude of the input signal and the second computer computes the instantaneous phase of the input signal. A third digital computer acts on the output of the second computer and differentiates the instantaneous phase of the signal with respect to time to provide frequency modulation output.

1 Claim, 8 Drawing Figures

DIGITAL QUADRATURE DEMODULATOR

CROSS-REFERENCE TO RELATED APPLICATIONS

The present invention is a continuation-in-part of U.S. patent application Ser. No. 809,720, filed Mar. 24, 1969 entitled DIGITAL QUADRATURE DEMODULATOR and U.S. patent application Ser. No. 30,169, filed Apr. 20, 1970 entitled DIGITAL QUADRATURE DEMODULATORS AND TAPE RECORDING SYSTEMS EMPLOYING DIGITAL QUADRATURE DEMODULATORS, both abandoned.

BACKGROUND OF THE INVENTION

This invention relates to signal demodulators and, more particularly to digital signal demodulator systems which include an analog-to-digital sampler to provide sampled data in quadrature.

The rapid development of the digital computer art has led to the widespread adoption of digital techniques in the electrical arts. It has, for example, been proposed to employ digital computers in communications systems. However, this application of the digital computer has been limited to the use of the computers as monitoring or control devices. The high speed and flexibility of the digital computer has not, in the past, been fully exploited by incorporating the computer as an integral part of the communication system itself.

The inroduction of digital technology in the communications arts has required the development of analog-to-digital samplers to sample analog signals and provide the samples in digital form. The sampling rate used in such systems is determined by the modulation frequency or bandwidth, not by the carrier frequency used to convey the modulation. Thus, as long as the sampling aperture is narrow as compared to the carrier period, the sampling rate may be approximately the same as the bandwidth of the modulation. With presently available circuit components bandwidths in excess of 10 $MH_z$ may be processed by such digital means using the principles of the present invention.

There has also been a growing interest in a mathematical approach to communications systems. This has led to the development, for example, of phase-locked-loop demodulation systems of the type shown in U.S. Pat. No. 3,099,798 which are widely used in communications systems to provide amplitude, phase, and frequency demodulation. Such systems perform a linear detection of phase and amplitude over a limited range of phase shift and are therefore limited in application to narrow bandwidth signals not subject to wide frequency deviations. Systems of this character are also easily unlocked and require the use of analog circuitry to perform the detection.

Another mathematical approach is suggested in U.S. Pat. No. 3,045,180. This patent teaches that a signal could be analyzed by means of the use of two quadrature channels to provide sine and cosine functions of the signal which are applied to a rectangular-to-polar coordinate converter providing outputs related to the amplitude and phase of the signal. The system shown in this patent, however, employs analog techniques and an electro-mechanical servo loop. It is therefore limited to low frequency applications.

A generally similar system is disclosed on page 129 of Viterbi, *Principals of Coherent Communication*, published in 1966 by McGraw-Hill Book Company, New York as an estimator of the phase of a sinusoid of known amplitude and frequency with uniform prior-phase probability density. Viterbi also discloses on page 275 the use of a circuit of this character as an element on a frequency estimator.

SUMMARY OF THE INVENTION

It is a principal object of the present invention to provide an improved demodulation system.

More specifically, it is an object of the present invention to provide a demodulation system employing digital computers for performing all detection operations, including amplitude demodulation, phase demodulation, and frequency demodulation.

A further object of the invention is the provision of a demodulation system which will perform a linear detection over a virtually unlimited dynamic range. Another object is the provision of a system of this character which provides a linear discrimination characteristic and which cannot be unlocked. A related object is the provision of a demodulation system employing digital techniques to perform a mathematically ideal detection.

Briefly, it is contemplated by the invention that a demodulation system include a quadrature analog-to-digital sampling device for providing first and second quadrature samples of an input data signal which is modulated in amplitude, phase, and/or frequency. The sampling device operates at a minimum rate which is equal to the bandwidth of the signal. A first digital computer computes the amplitude modulation function of the signal by calculating the square root of the sum of the squares of the quadrature samples. A second digital computer calculates the instantaneous phase of the input signal by calculating the value of the angle whose tangent is equal to the ratio of the cosine and sine quadrature functions provided by the sampler. A third digital computer differentiates the phase parameter computed in the second digital computer with respect to time to provide frequency demodulation.

Although not necessary in a normal detection operation, in order to permit a reduction of the sampling rate to a value equal to the bandwidth of the signal, it is possible, when computing the frequency of the signal, to subtract from the computed phase of the signal a value $\theta_k$ which is equal to $2\pi f_o \Delta t_d$, where $f_o$ is the center of frequency of the signal (i.e., the carrier frequency) and $\Delta t_d$ is the time interval between successive quadrature time sample pairs. Alternately, this function may be performed by heterodyning the raw input signal against a local oscillator operating at the carrier frequency prior to processing the modulation signal according to the manner of the present invention.

Several techniques are contemplated for deriving the quadrature digital samples. In one embodiment, a single-channel analog-to-digital sampler is successively caused to sample the input signal by providing timing signals at a first time and at a second time delayed ninety degrees in phase at the center frequency of the signal with appropriate switching means being provided to direct the successive samples to separate quadrature outputs. In a second embodiment, quadrature signals are derived from the input signal on an analog basis by providing a quadrature oscillator and a pair of mixers, and the quadrature analog signals are applied to a two-channel analog-to-digital sampler for simultaneous sampling of the quadrature signals. In a third embodiment, a single-channel analog-to-digital sampler provides a digital sample which is then multiplied by digital quadrature signals provided by a quadrature digital local oscillator to provide a pair of digital quadrature samples.

The foregoing and other objects, advantages, and features of the invention and the manner in which the same are accomplished will become more readily apparent upon consideration of the following detailed description of the invention when taken in conjunction with the accompanying drawings, which illustrate preferred and exemplary embodiments of the invention.

DESCRIPTION OF THE PREFERRED EMBODIMENTS

Figure 1:
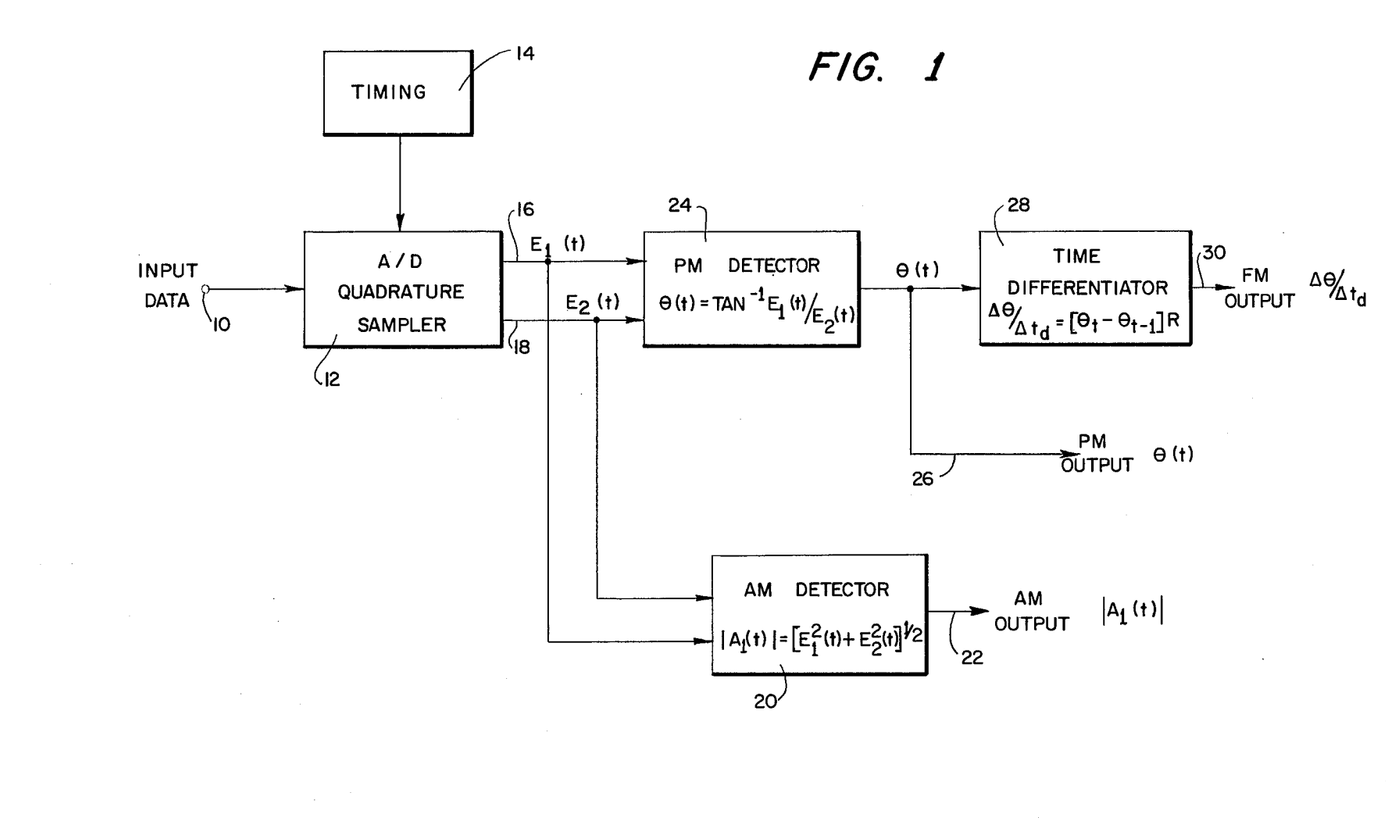
FIG. 1 is a schematic diagram of a general form of a digital quadrature demodulator system of the invention.

Referring to FIG. 1, it will be seen that a demodulator system of the invention may include an input terminal 10 for receiving an input data signal which may vary in amplitude, phase, and/or frequency. This signal may, for example, be received from a radio receiver, tape recorder, or measuring instrument, such as a proton precession magnetometer. The signal is applied to an analog-to-digital quadrature sampler 12, the sampling rate of which is controlled by means of a timing device 14. The quadrature sampler will provide a pair of signals $E_1(t)$ on an output terminal 16 and $E_2(t)$ on an output terminal 18, these two signals being in quadrature with respect to each other. These quadrature voltage samples $E_1(t)$ and $E_2(t)$ may be expressed in accordance with the following equations:

$$E_1(t) = A_1 \cos \omega t + \phi \qquad (1)$$

$$E_2(t) = A_1 \sin \omega t + \phi \qquad (2)$$

where $\omega$ is equal to the instantaneous angular frequency of the signal, $t$ is equal to the time when the sample is taken, and $\phi$ is equal to the initial phase of the signal. These quadrature voltages are therefore the two cartesian coordinate projections of the vector $A_1$ representing the amplitude and phase of the signal. It follows logically that:

$$|A_1(t)| = [E_1^2(t) + E_2^2(t)]^{\frac{1}{2}} \qquad (3)$$

since $$[\cos^2\omega t + \sin^2\omega t] = 1.0 \text{ and } \theta(t) = \tan^{-1}(E_1(t)/E_2(t)) \qquad (4)$$

where $\theta(t)$ is the instantaneous phase of the vector $A_1$.

It will be apparent from the foregoing that calculation of equation (3) will constitute amplitude demodulation of the signal. This is accomplished in any suitable digital computer 20 which serves as an amplitude modulation detector by solving equation (3), and providing on its output terminal 22 the amplitude modulation output representing the instantaneous amplitude of the input data signal. A preferred form of the computer 20 will be described in more detail subsequently. It is also contemplated that phase demodulation will be effected by calculating the value of equation (4). To this end, any suitable digital computer 24 is provided for solving equation (4) and providing on its output terminal 26 the phase demodulation output of the signal representing the instantaneous phase of the input data signal. A preferred form of computer 24 will be described in more detail subsequently. Thus, amplitude modulation, as evidenced by changes in the instantaneous amplitude of the absolute value of $A_1(t)$, is demodulated as the output on terminal 22, and phase modulation which exists as changes in the instantaneous value of the phase function $\theta(t)$, is demodulated as the output on terminal 26.

In order to frequency demodulate the signal, the phase function is differentiated with respect to time as follows:

$$(\Delta \theta / \Delta t_d) = [\theta_t - \theta_{t-1}] R \qquad (5)$$

where $\theta_t$ is the instantaneous phase of the present time sample of $\theta$. $\theta_{t-1}$ is the instantaneous phase of the previous time sample of $\theta$. $\Delta t_d$ is equal to the time interval between successive quadrature time sample pairs, and R is equal to $(1/\Delta t_d)$, the known time rate of data sampling. In order to calculate the value of equation (5), any suitable digital computer 28 is provided which is capable of forming the solution of equation (5) on its output terminal 30. A preferred form of the computer 28 will be described in more detail subsequently.

With regard to the sampling rate R, it is to be noted that the Nyquist sampling criteria requires that a signal be sampled at a minimum rate equal to at least twice the maximum frequency included in the analog signal. For frequencies confined to a passband of width $\Delta f$ about a carrier frequency $f_o$, the minimum sampling rate $R_{min}$ could be expressed as follows under the Nyquist criteria:

$$R_{min} = 2 [f_o \pm \Delta f/2] = 2f_o \pm \Delta f \qquad (6)$$

where $f_o$ is the center frequency of the signal band and $\Delta f$ is the width of the signal band. It will be noted that the first term "$2f_o$" of equation (6) is constant and may be subtracted out as previously stated. The minimum Nyquist sampling rate is therefore simply $\Delta f$. It should be emphasized, however, that $\Delta f$ is the aliasing bandwidth, and not the commonly employed $-3$db. bandwidth. The aliasing bandwidth may be at the $-20$db. level or lower, depending upon the allowable aliasing. It is to be understood that the term "bandwidth" as used herein refers to the bandwidth of uncertainty of the signal itself and of the noise which accompanies it. It refers to the signal and noise frequencies which are predictably within the band of the signal. After, for example, a signal has passed through a circuit component of the system, such as a filter or an intermediate-frequency amplifier, having a restricted passband, the signal and noise may be said to be predictably within the band of the component.

Although, as has been shown, it is easy to demonstrate that sampling may be reduced to a minimum rate of $\Delta f$ for demodulating phase data, this principle is equally applicable for the case of amplitude demodulation: neither the signal amplitude nor phase can change too rapidly when the signal is totally confined to a narrow bandwidth. By virtue of equation (6), sampling of data at virtually any intermediate or radio frequency rate proportional to the bandwidth of the signal, and without regard to the center frequency of the signal, is possible. Of course, other factors such as aperture time (the width of the sampling interval), which should be as close to zero as possible, must be considered; but such factors need not be of any special concern, since aperture times are already in use which permit successful sampling at microwave frequencies.

When a sampling rate is chosen in accordance with equation (6), it may be necessary to center the frequency discriminator about a frequency $f_o$ other than zero. Equation (5) must then be modified to reflect this shift in the center frequency of the discriminator, as follows:

$$\Delta\theta/\Delta t_d = [\theta_t - \theta_{t-1} \theta_k] R \qquad (7)$$

where $\theta_k = 2\pi f_o \Delta t_d$.

Figure 2:
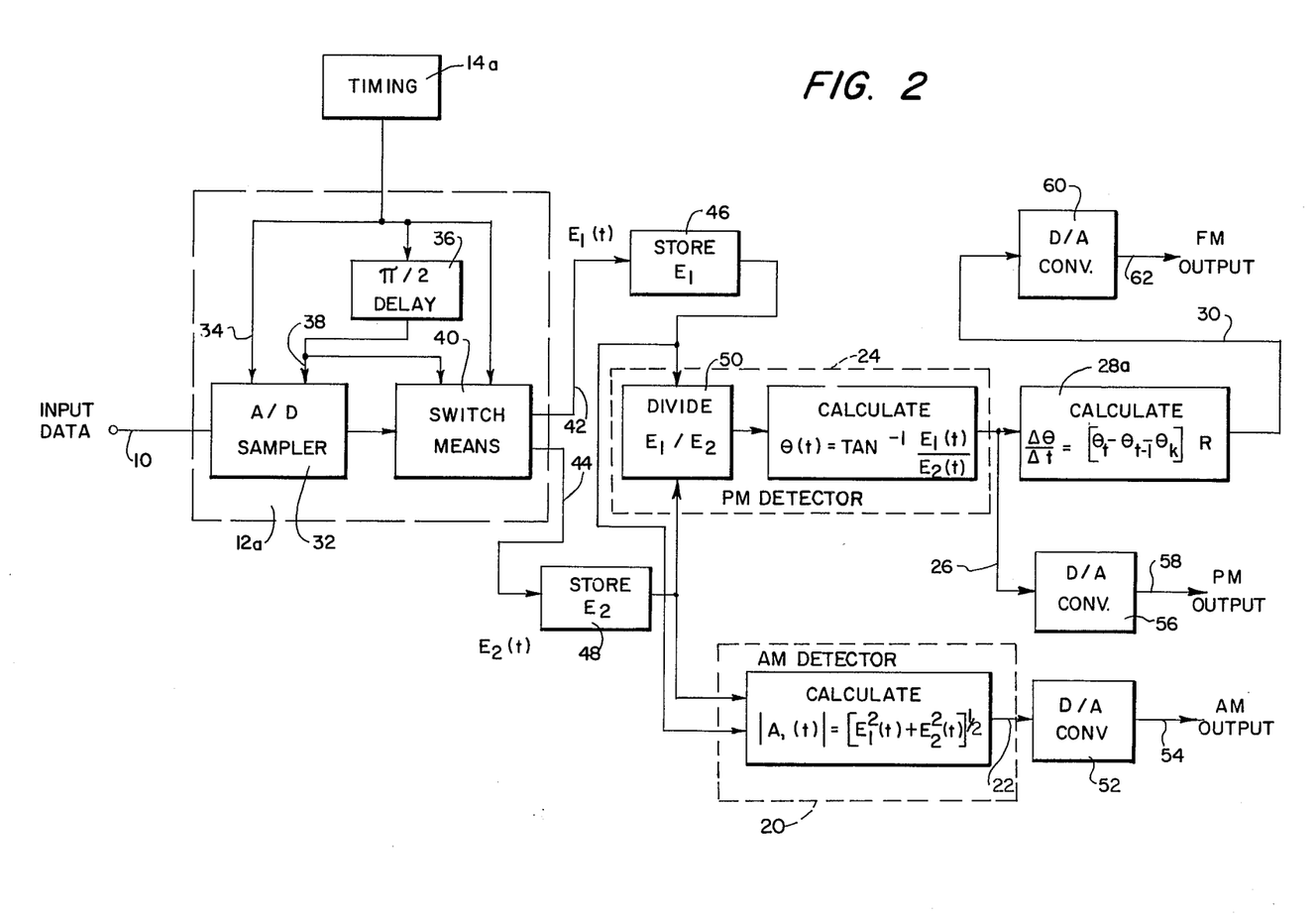
FIG. 2 is a schematic diagram of an embodiment of the invention.

It is sometimes desirable in order to accommodate the operating parameters of the computers to provide intermediate storage of the signals supplied by the quadrature analog-to-digital sampler. This is illustrated in the embodiment of FIG. 2, which also shows one specific form of a quadrature analog-to-digital sampler. As before, an input data signal, which will vary in amplitude, phase and/or frequency in accordance with some function, will be applied to input terminal 10 and be coupled to the quadrature analog-to-digital sampler 12a. Sampler 12a includes a single channel analog-to-digital sampler 32 whicn is operated sequentially to provide the two quadrature signals. This is accomplished by employing a timing device 14a which provides a timing signal to an input terminal 34 of analog-to-digital sampler 32 to provide a first sample signal. Then, by passing the timing signal from timing device 14a through a delay device 36 which provides a delay of $(\pi/2)$ radians at the center frequency $f_o$, a second sample is obtained at a time delayed $(\pi/2)$ radians at the center frequency $f_o$ from the first sample signal. In order to separate these signals and apply them to separate output channels, a switch means 40 is included within sampler 12a. It is to be understood, as diagrammatically illustrated, that switch means 40 will be synchronized, or otherwise related in time, with the signals applied to terminals 34 and 38 so that the first sample $E_1(t)$ will be applied to output terminal 42 and the second sample $E_2(t)$ will be applied to the second output terminal 44. Since, as mentioned above, it is desired to provide an intermediate buffer storage, the sample $E_1(t)$ is applied to a store 46 and sample $E_2(t)$ is applied to store 48. It is to be understood that each of the stores 46 and 48 may comprise a chain of flip-flops forming a register with typically an eight or ten bit capacity. The stores 46 and 48 may directly apply their outputs to digital computer 20 for calculating the instantaneous amplitude of the input data signal, as previously described. Since the output signal of the computer 20 is in digital form, it may be desired to convert it to analog form; and, for this reason, the output signal on terminal 22 is shown as applied to a digital-to-analog converter 52 to provide an analog amplitude modulation output 54. This would be particularly appropriate in the case of the detection of voice modulation signals.

The outputs from stores 46 and 48 may also be applied to a digital divide circuit 50 which may be of the conventional read-only memory (ROM) type, "pipeline", subtract and shift type or other suitable type. This divider 50 provides the ratio of the two quadrature sample signals which will then be employed in digital computer 24 for computing the value of $\theta(t)$ as previously described. The digital phase modulation output on terminal 26 may be converted to analog form by a digital-to-analog converter 56 providing an analog phase modulation output on terminal 58. The output from digital computer 24 may also, as previously described, be provided to a digital computer which will differentiate the instantaneous phase value $\theta(t)$ as a function of time as previously described. It is to be noted, however, that in FIG. 2 digital computer 28a has been adjusted to compensate for a lower sampling rate by centering it about frequency $f_o$ by calculating the value of equation (7). This is easily accomplished as the additional factor $\theta_k$ is known beforehand and remains constant. The digital frequency modulation output on terminal 30 may then be converted to analog form by digital-to-analog converter 60 to provide an analog frequency modulation output on output terminal 62.

Figure 3:
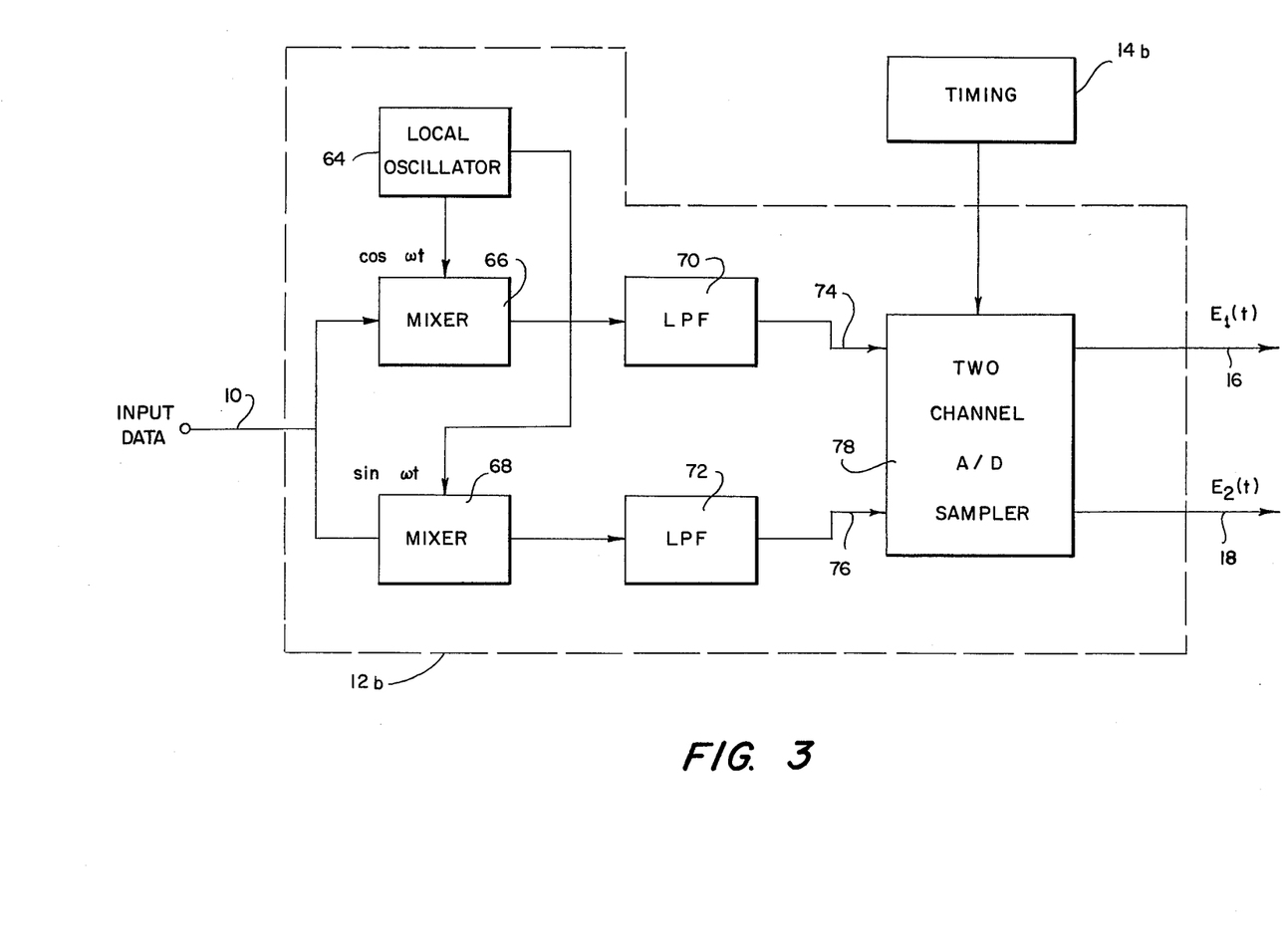
FIG. 3 is a schematic diagram of a portion of a second embodiment of the invention.

Although the sampling technique shown in FIG. 2 has the advantage that it avoids the need for analog mixing or digital multiplication and filtering, thus simplifying the detection circuit significantly, it will work well only as long as the bandwidth of the signal $\Delta f$ is small compared to the center frequency $f_o$. When this is not the case, alternate means can be provided for obtaining the quadrature digital signals. They may, for example, be provided by the quadrature analog-to-digital sampler 12b shown in FIG. 3. In this sampler, the quadrature signals are developed on an analog basis. Thus, the input data signal is applied to input terminal 10 and from input terminal 10 to a pair of signal mixers 66 and 68. A quadrature local oscillator 64 applies a cosine signal to mixer 66 and a sine signal to mixer 68, as is well known in the art. The quadrature output signal from mixer 66 is filtered by an analog lowpass filter 70 to remove sum frequency components, while the quadrature signal from mixer 68 is filtered by an analog low pass filter 72 for the same purpose. The two quadrature signals from filters 70 and 72 are applied to two input terminals 74 and 76 of a two-channel analog-to-digital sampler 78. Sampler 78 is controlled by a timing device 14b to simultaneously sample the quadrature analog signals applied to terminals 74 and 76, providing digital quadrature signals $E_1(t)$ on output terminal 16 and $E_2(t)$ on output terminal 18.

Figure 4:
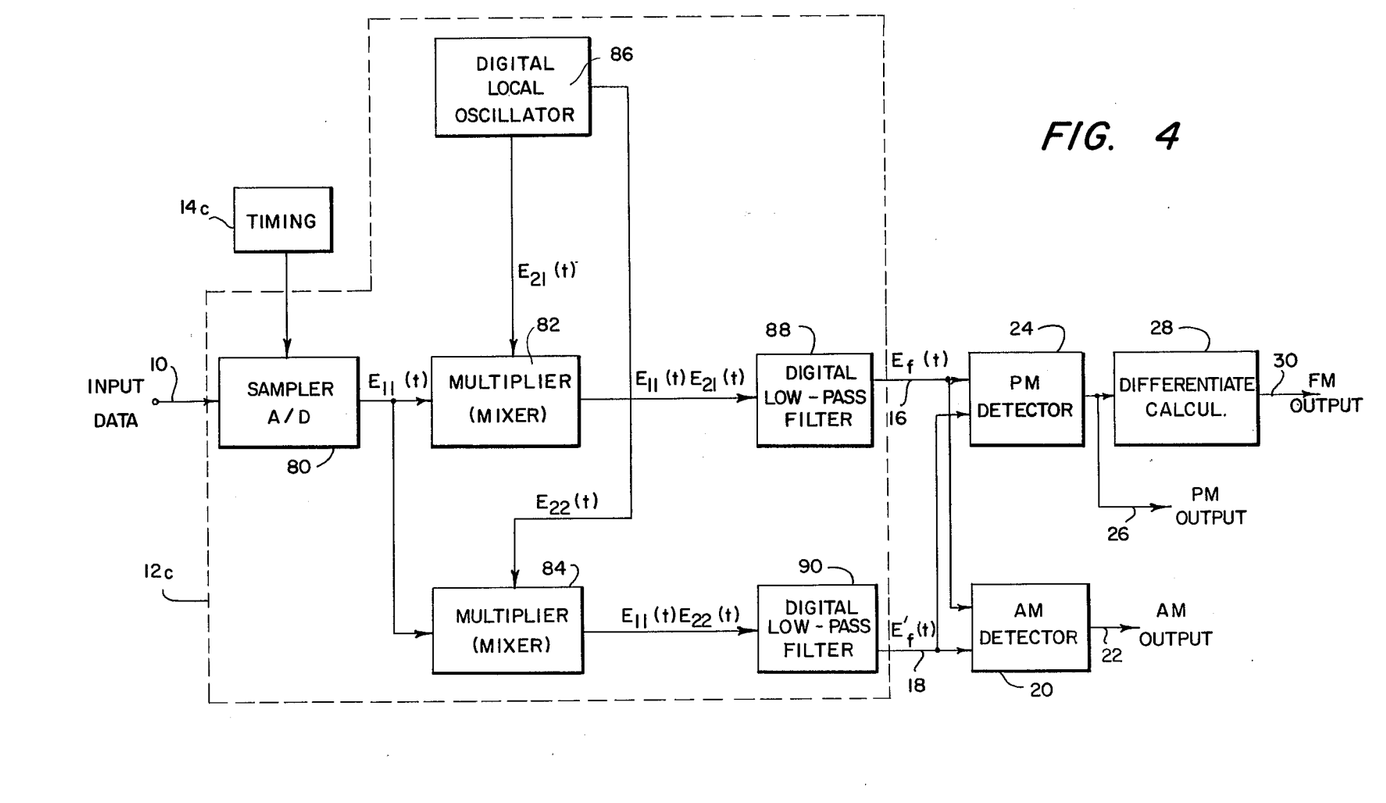
FIG. 4 is a schematic diagram of a third embodiment of the invention.

Another technique for developing the quadrature digital signals is illustrated in FIG. 4. Here, the analog-to-digital quadrature sampler 12c receives the analog input data signal from terminal 10 and applies it to a single channel analog-to-digital sampler 80 which is controlled by a timing device 14c. Sampler 80 provides an output signal $E_{11}(t)$ to a pair of digital multipliers or mixers 82 and 84. A digital local oscillator, or function generator 86, which will be discussed in more detail subsequently, provides quadrature digital signals $E_{21}(t)$ and $E_{22}(t)$ to multipliers 82 and 84, respectively. Multipliers 82 and 84 may be of the read only memory (ROM) type, the add and shift type, "pipeline" type or other conventional multipliers known in the art. Thus, multiplier 82 provides an output signal $E_{11}(t) E_{21}(t)$, and the multiplier 84 provides an output signal $E_{11}(t) E_{22}(t)$. If it be assumed, that incoming signal $$E_{11}(t) = A_1 \cos \omega_1 t \text{ and that}$$

$$E_{21}(t) = A_2 \cos \omega_2 t \text{ and } E_{22}(t) = A_2 \sin \omega_2 t,$$

it will be seen that $$E_{11}(t) E_{21}(t) = (A_1A_2/2) \cos (\omega_1 - \omega_2)t + (A_1A_2/2) \cos (\omega_1 + \omega_2)t \quad (8)$$

and $$E_{11}(t) E_{22}(t) = (A_1A_2/2) \sin (\omega_1-\omega_2)t + (A_1A_2/2) \sin (\omega_1+\omega_2)(t). \quad (9)$$

Making $A_2 = 2$, and filtering out the sum frequencies by means of low pass digital filters 88 and 90, respectively, which are designed to closely approximate an analog low pass filter, we then have:

$$E_{11}(t) E_{21}(t) = A_1 \cos (\omega_1 - \omega_2)t = E_f(t) \quad (10)$$

and $$E_{11}(t) E_{22}(t) = A_1 \sin (\omega_1 - \omega_2)t = E'_f(t). \quad (11)$$

The signal $E_f(t)$ will therefore be the equivalent of $E_1(t)$ in the previously discussed embodiments, and the signal $E'_f(t)$ will be the equivalent of signal $E_2(t)$ discussed in the other embodiments. Thus, these signals may be applied to amplitude modulation detector digital computer 20 to provide an amplitude modulation output on terminal 22. They also may be applied to phase modulation detector digital computer 24 to provide a phase modulation output on terminal 26. In like manner, as previously described, the output from phase modulation detector 24 may be applied to frequency modulation digital computer 28 which will differentiate the phase signal with respect to time to provide a frequency modulation output on terminal 30.

Digital demodulation systems according to the present invention will have wide utility and may, for example, be used to demodulate any radar, radio tracking, or communication signal. Any signal whose bandwidth is within the sampling bandwidth and computation time constraints of the analog-to-digital sampler and the demodulation computers may be processed. The computer may be employed for automatically adjusting the amplitude and frequency of a receiver, thus providing its own AFC and AGC. Demodulating systems according to the invention may also be employed to calculate the signal-to-noise ratio and warn of any unusual signal characteristics which might interfere with normal communication. In short, demodulation systems according to the invention can be employed as a good automatic radio "operator", continuously monitoring the detailed characteristics of the signal and automatically adjusting itself as needed. The invention also has applicability to the detection of signals developed by measuring devices such as proton precision magnetometers. Digital demodulator systems according to the invention may also be employed in connection with the control tape recorder systems and the like.

Figure 5:
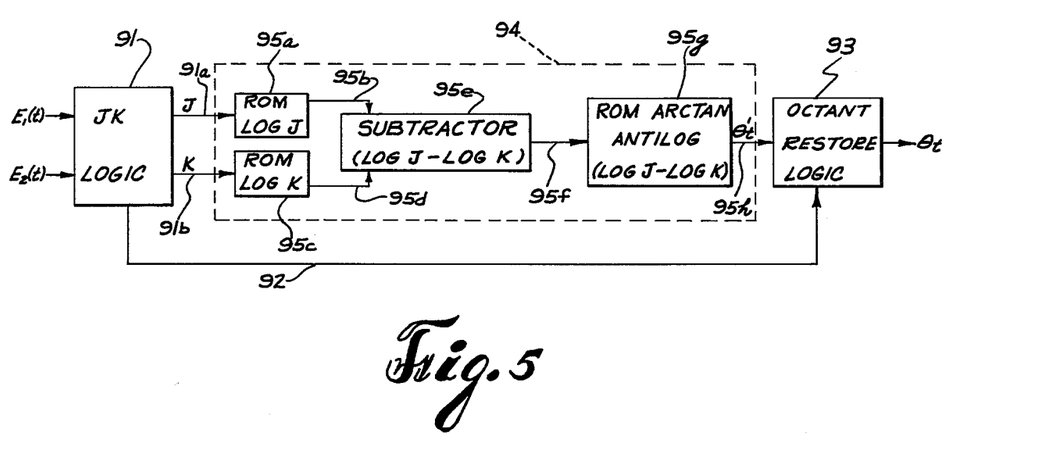
FIG. 5 is a schematic diagram of a special purpose digital PM detector computer as 24 of FIG. 1.

Referring now to FIG. 5, one embodiment of a special purpose digital computer adapted to perform the function of computer 24 of FIG. 1 is shown in more detail, but still schematically. The two quadrature related digital input signals $E_1(t)$ and $E_2(t)$ are shown as input to a device 91 labelled JK logic. The rearrangement of the $E_1$ and $E_2$ signals into the JK logic form is performed in order to simplify the subsequent circuitry. The JK logic circuitry comprises conventional means known in the art to discern which of the two input variables is larger in magnitude. The variable having the larger magnitude, be it $E_1$ or $E_2$, is output as an unsigned number from JK logic circuit 91 on the output line labelled K. The smaller magnitude variable is output similarly on the output line J.

The algebraic signs and relative magnitude information $E_1$ and $E_2$ comprises 3 information bits which are used to determine which octant the resultant arctangent lies in, and this information is passed via a third output line 92 to octant restore logic circuitry 93. J and K are always positive real numbers, where $E_1(t)$ and $E_2(t)$ may be either positive or negative. Since J/K is always equal to or less than one, the input $\theta'_t$ to the logic 93 will always be equal to or less than 45° and the octant restore logic 93 is employed to restor $\theta$ over 360° in accordance with instructions (3 bits) from logic 91. If desired, in the case where $E_1(t) = E_2(t)$ the JK logic 91 may bypass the divider 94 to give the logic 93 the answer $\theta'_t = 45°$.

The numbers on lines 91a and 91b are input to a divider 94 which provides the digital output $\theta'_t$ which is $\theta_t$ for one octant. The output together with the 3 bits previously mentioned from the JK logic circuit are input to the octant restore logic circuitry 93. The octant restore logic either adds or subtracts fixed increments of angle to the first octant value $\theta'_t$ to determine the true phase angle $\theta_t$ based on the 3 information bits according to the following table:

| BIT 1 $E_1$ | BIT 2 $E_2$ | BIT 3 RELATIVE MAGNITUDE | TO RESTORE $\theta$ TO CORRECT OCTANT |
|---|---|---|---|
| + | + | $E_1 < E_2$ | $\theta + 0°$ |
| + | + | $E_1 > E_2$ | $90° - \theta$ |
| + | − | $E_1 > E_2$ | $90° + \theta$ |
| + | − | $E_1 < E_2$ | $180° - \theta$ |
| − | − | $E_1 < E_2$ | $180° + \theta$ |
| − | − | $E_1 > E_2$ | $270° - \theta$ |
| − | + | $E_1 > E_2$ | $270° + \theta$ |
| − | + | $E_1 < E_2$ | $360° - \theta$ |

The final result of the octant restore logic circuit 93 is to provide a digital output $\theta_s$ which is equal to the instantaneous phase of the input signal at the sample time. The special purpose digital computer 24 herein described may thus be used for detection of phase modulation signals in a system such as shown in FIGS. 1 to 4 in this manner.

While any suitable divider may be employed for the circuit 94, the preferred form of the divider employs read-only memories (ROMs) to perform the required functions. Further information on ROMs and their use in logic design may be obtained by reference to: U.S. Pat. No. 3,654,450 to the applicant herein filed Apr. 3, 1970 and entitled "DIGITAL SIGNAL GENERATOR" and to Kvamme, Floyd, "Standard Read-Only Memories Simplify Complex Logic Design", ELECTRONICS, Jan. 5, 1970. Generally, ROMs are high speed read-only memories which function as "lock-up tables" to provide a unique output, or answer for every combination of input words.

In the circuit of FIG. 5, the digital signal on line 91a is input to an ROM 95a which forms a digital output on line 95b representing the log of the number J which is input to the ROM. The signal on line 91b is similarly input to a second ROM 95c which forms an output on a line 95d representing the log of the number K which is input to the ROM. By converting to the log of the numbers J and K with the ROMs 95a and 95c, the operation of dividing J by K may be effected by simply subtracting the log of K from the log of J with a simple subtractor 95e. The result of this subtraction is placed on an output line 95f and input to a third ROM 95g which provides a digital output on line 95h representing θ'. It should be noted that if desired, the ROM 95g may be formed by two separate ROMs, the first of which would convert to the antilog number for J/K while the second would convert to the arctan J/K.

Figure 6:
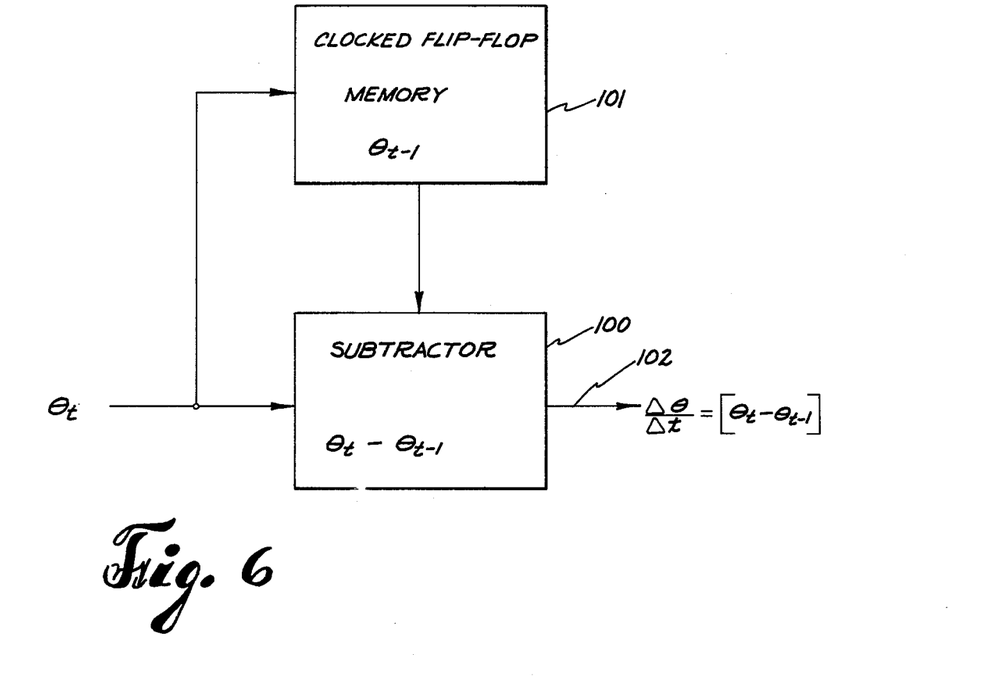
FIG. 6 is a schematic diagram of a special purpose digital time differentiator computer as 28 of FIG. 1.

Referring now to FIG. 6, one embodiment of a special purpose digital computer adapted to perform the function of the computer 28 of FIG. 1 is shown in more detail but still schematically. A digital signal $\theta_t$ equal to the instantaneous phase of the input signal (as supplied for example by the output of computer 24 just discussed) is applied to the input terminals of a subtractor 100 and a flip-flop memory register 101. The register 101 is of a conventional type which accepts an input only when commanded to do so. Just before the number $\theta_t$ is replaced by a new number, the register 101 is commanded to accept the number $\theta_t$ which then becomes $\theta_{t-1}$ for the next interval. The output $\theta_{t-1}$ from the memory 101 is subtracted by the subtractor from the input $\theta_t$ to form the desired output $\theta_t - \theta_{t-1}$ on line 102 which equals (within a constant factor) the desired frequency modulation output $\Delta\theta/\Delta t$.

Figure 7:
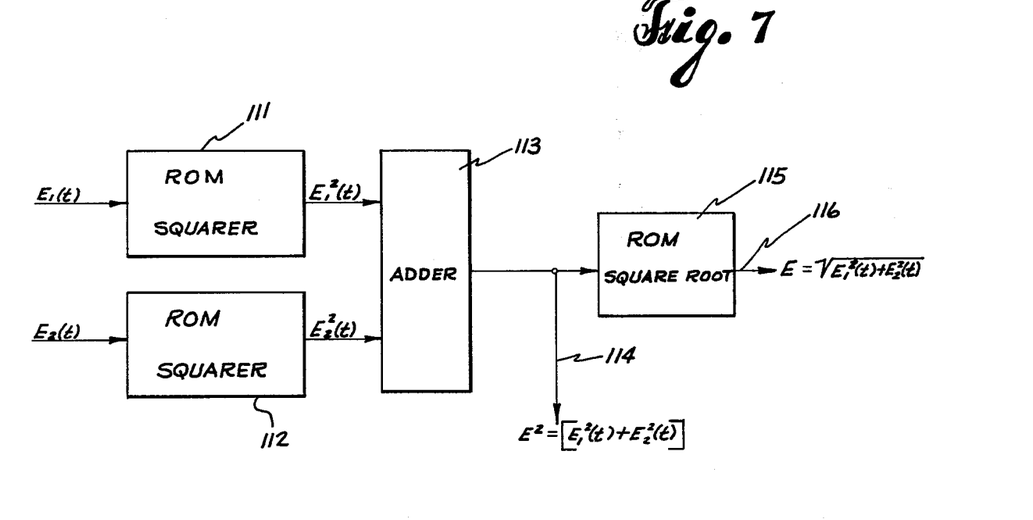
FIG. 7 is a schematic diagram of a special purpose digital computer for AM detection as 20 of FIG. 1.

Referring now to FIG. 7, one embodiment of a special purpose digital computer adapted to perform the function of computer 20 of FIG. 1 is shown in more detail, but still schematically. The two quadrature related digital inputs $E_1(t)$ and $E_2(t)$ are separately input to ROMs 111 and 112 respectively which provide the square of the numbers appearing at their inputs. The squared numbers are added by an adder 113 and the total $E_1^2(t) + E_2^2(t) = E^2$ is output on a line 114. If desired, a third ROM 115 may be employed to extract the square root of $E^2$ to E on an output line 116.

Figure 8:
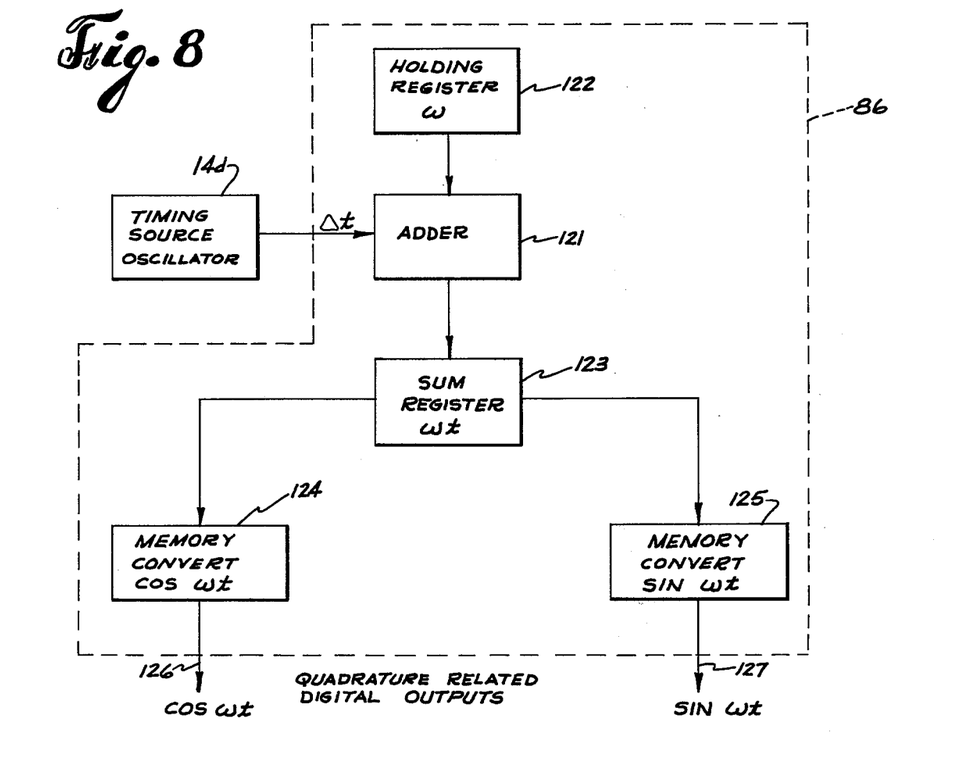
FIG. 8 is a schematic diagram of a digital quadrature local oscillator as 86 of FIG. 4.

Referring now to FIG. 8, special purpose digital circuitry comprising one embodiment of a digital quadrature local oscillator such as 86 of FIG. 4 is shown in more detail, but still schematically. In the digital oscillator of FIG. 8, a timing source 14d supplies pulses to an adder 121 every $\Delta t$ (where $\Delta t$ is the period of the oscillator). A holding register 122 is provided in the oscillator which contains, in binary form, the prior known operating angular frequency ω, of the digital oscillator. Upon receipt of the timing pulse from timing source 14d the adder 121 adds the contents of the holding register 122 to the contents of a summing register 123. Thus, the quantity in the sum register 123 at any time t represents the quantity ωt or the current phase angle of the digital oscillator. It should be mentioned here that the holding register 122, adder 121 and sum register 123 are chosen to be of a convenient length so that the sum register 123 will overflow and recycle once for each operating cycle of the digital oscillator. The angular frequency ω may be conveniently scaled for this purpose when loaded in register 122.

In any event, at a given time t in a cycle of operation of the digital oscillator 86 of FIG. 8, the sum register 123 contains a quantity equal to ωt, the current phase of the oscillator. This quantity is supplied simultaneously to two memory convert circuits 124 and 125 of the type previously discussed. These read only memory circuits supply an output signal on output lines 126 and 127 which represents cos ωt on line 26 and sin ωt on line 127, the conversion being performed as previously described. Thus, oscillator 86 provides, for each $\Delta t$ increment of time, two quadrature related digital signals for use as previously described.

It will be appreciated by those skilled in the art that the embodiments of the special purpose digital computer circuits shown in FIGS. 5-8 are exemplary and may make other alternate computer configurations evident. It will also be apparent to those skilled in the art that the outputs of the A/D quadrature samplers could be supplied to suitable interface equipment and from there to a suitable general purpose digital computer for further processing. General purpose digital computer systems such as the IBM system 360 or system 370, Models 50 of 65, the Control Data Corporation 6600 system, the Univac 1130 system or others may be utilized for this puspose when suitably programmed. The programming of such a system for this purpose would be apparent to a programmer of ordinary skill given the relationships of Equations (3), (4), (5) and (7) and the present disclosure. It is the intent and aim of the present application to cover any such "software" equivalents to the method and apparatus of the present invention by this application.

While preferred embodiments of the invention have been shown and described, it will be apparent to those skilled in the art that changes can be made without departing from the principles and spirit of the invention, the scope of which is defined in the appended claims. Accordingly, the foregoing embodiments are to be considered as illustrative rather than restrictive of the invention, and those modifications which come within the meaning and range of equivalency of the claims are to be included therein.

The invention claimed is:

1. A demodulation system for demodulating an angle modulated input signal comprising:
quadrature analog-to-digital sampling means for providing a first quadrature sample signal $E_1(t)$ of said input signal and a second quadrature sample signal $E_2(t)$ of said input signal, said sample signals being defined by the equations:

$E_1(t) = A_1\cos\omega t + \phi$
$E_2(t) = A_1\sin\omega t + \phi$ where $A_1$ is the vector representing the instantaneous amplitude of the input signal, ω is the instantaneous frequency of the input signal, t is the time when the sample signal is taken, and $\phi$ is the initial phase of the input signal; digital processing means for operating on a pair of said quadrature sample signals to provide an output signal related to the instantaneous phase angle of said input signal; means for mixing the input signal with a locally generated signal twice, once in each of two channels; means for shifting the phase of a locally generated signal by π/2 radians in one channel; means for filtering the sum and residual original frequencies of said mixed signals to obtain difference frequencies in quadrature phase relationship to one another; and means for simultaneously sampling said difference frequencies to form an output signal related to the instantaneous phase angle of said input signal.

* * * * *